US006313708B1

(12) United States Patent
Beaulieu

(10) Patent No.: US 6,313,708 B1
(45) Date of Patent: Nov. 6, 2001

(54) ANALOG PHASE LOCKED LOOP HOLDOVER

(75) Inventor: Rejean Beaulieu, Mercier (CA)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/625,698

(22) Filed: Jul. 26, 2000

(51) Int. Cl.[7] .................................. H03L 7/06; H03L 7/08
(52) U.S. Cl. .......................... 331/17; 331/1 A; 331/14; 331/18; 331/25; 327/156
(58) Field of Search ............................. 331/1 A, 8, 14, 331/17, 18, 25, DIG. 2; 327/156–159; 360/51; 375/376; 455/260

(56) References Cited

U.S. PATENT DOCUMENTS

| 5,216,374 | * | 6/1993 | George et al. ............ 328/14 |
| 5,254,955 |   | 10/1993 | Saeki et al. ............ 328/155 |
| 5,410,572 | * | 4/1995 | Yoshida ............ 375/376 |
| 5,892,408 | * | 4/1999 | Binder ............ 331/44 |

* cited by examiner

Primary Examiner—David Mis
(74) Attorney, Agent, or Firm—Jones, Day, Reavis & Pogue

(57) ABSTRACT

A phase locked loop (PLL) circuit is provided having: (1) a phase detector coupled to a reference clock signal and a feedback signal for generating positive and negative phase detection signals corresponding to the phase difference between the reference clock signal and the feedback signal; (2) an integrator coupled to the positive and negative phase detection signals for generating an output voltage proportional to the pulse width of either the positive or negative phase detection signals, the integrator including an operational amplifier having positive and negative inputs; (3) a voltage controlled oscillator coupled to the output voltage of the integrator for generating a local oscillator signal with an oscillation frequency proportional to the output voltage of the integrator; (4) a feedback circuit coupled to the local oscillator signal for generating the feedback signal; and (5) an analog holdover circuit for generating an input to the integrator when the phase detector stops receiving the reference clock signal.

36 Claims, 2 Drawing Sheets

ANALOG PHASE LOCKED LOOP HOLDOVER

BACKGROUND OF THE INVENTION

1. Technical Field

The present invention is directed to the field of phase locked loops. More specifically, the invention provides an improved phase locked loop ("PLL") that includes an analog holdover mechanism. The analog holdover mechanism enables the PLL to continue to operate without a large frequency shift when there is a problem with the external reference clock signal.

2. Description of the Related Art

Phase locked loops are well-known elements in analog and digital circuit design. A phase locked loop operates by receiving an external reference clock signal and generating a localized oscillator signal that is synchronized with the external reference clock signal. The local oscillator signal may operate at the same frequency as the reference clock signal or at some integer multiple of that frequency. A general description of the theory and operational characteristics of a PLL is contained in Couch, *Digital and Analog Communication Systems*, Fourth Edition, pp. 289–296.

FIG. 1 is a circuit diagram of a known PLL circuit 10. This circuit 10 includes four primary elements—a phase detector 14, an operational amplifier 26, a voltage controlled oscillator (VCXO) 32, and a counter 36. This circuit 10 generates a local oscillator signal (PLL clock) 34 that is synchronized with an external reference clock signal 12, but which operates at a higher frequency than the external reference clock 12. This is accomplished by feeding back a divided down version 38 of the local oscillator signal 34 to the phase detector 14, which then compares the phases of the reference clock signal 12 with the feedback signal 38.

The phase detector 14 has two inputs and two outputs, The two inputs of the phase detector 14 are coupled to the external reference clock signal 12 and the PLL feedback signal 38, and the two outputs 16A, 16B are coupled to the operational amplifier 26. If the PLL feedback signal 38 leads in phase with respect to the reference clock signal 12, then the phase detector 14 outputs a pulse on the negative phase output (ph−) 16A. Similarly, if the reference clock signal 12 leads in phase with respect to the PLL feedback signal 38, then the phase detector 14 outputs a pulse on the positive phase output (ph+) 16B. These output pulses on the positive and negative phase outputs 16A, 16B from the phase detector 14 are characterized by a pulse width that is equivalent to the phase difference between the two inputs.

When the phase difference between the reference clock signal 12 and the PLL feedback signal 38 is nearly zero degrees (i.e., when the PLL is "locked"), then the phase detector enters an operational region in which it cannot discriminate the phase difference between the two input signals. This operational region is referred to herein as the "mdead zone." As the phase difference of the two inputs approaches zero degrees, the phase detector 14 outputs minimum-width pulses on both the positive and negative phase outputs 16A, 16B.

The phase detector outputs 16A, 16B are coupled to the operational amplifier 26 through a pair of RC circuits. These RC circuits configure the operational amplifier 26 as an integrator 40. The negative phase output (ph−) 16A is coupled to the negative input of the operational amplifier 26 through the RC circuit composed of resistors 18, 28 and capacitor 30. And the positive phase output (ph+) 16B is coupled to the positive input of the operational amplifier 26 through the RC circuit composed of resistors 20, 22 and capacitor 24.

This integrator 40 receives the pulses from the phase detector outputs (ph+, ph−) 16A, 16B and generates a voltage level at its output that is proportional to the pulse width of the phase pulses. This phase voltage is then provided as an input to the voltage controlled oscillator (VCXO) 32.

The voltage controlled oscillator 32 generates an output clock signal, PLL clock 34, which is characterized by a frequency that is proportional to the phase voltage from the integrator. This clock signal, PLL clock 34, is the localized oscillator signal that is synchronized with the external reference clock 12. The PLL clock signal 34 is then fed back to one of the inputs of the phase detector 14 either directly, or via a counter 36.

The counter 36 is configured as a divide-by-N counter, and it generates the PLL feedback signal 38, which is a frequency divided version of the PLL clock signal 34. By selecting an appropriate value of N. a circuit designer can select the frequency of the PLL clock signal 34 with respect to the external reference clock 12. For example, if the circuit designer desires to generate a synchronized version of the reference clock signal 12, but at a frequency 10 times greater than the reference clock signal 12, then the value of N would be 10.

FIG. 2 is a timing diagram showing the operation of the PLL set forth in FIG. 1. This timing diagram sets forth, from top to bottom, the PLL clock signal 34, the reference clock signal 12, the PLL feedback signal 38, and the corresponding phase pulse signals on the positive and negative phase outputs 16B, 16A of the phase detector 14. As seen in this diagram, during normal operation (i.e., when the PLL is locked), the PLL clock signal 34 is in phase with the reference clock 12, but at a higher frequency. The PLL feedback signal 38 is nearly identical to the external reference clock signal 12 when the circuit is locked, and is in phase with this signal. When locking occurs, the phase difference between the PLL feedback signal 38 and the reference clock signal 12 is very small, and the phase detector 14 enters the "dead zone" region in which it cannot further discriminate between the phase difference of the two input signals 12, 38. In this region, the phase detector 14 outputs two extremely narrow pulses at the positive and negative phase outputs 16B, 16A, during the rising edge of the input clocks 12, 38.

One drawback of the circuit shown in FIG. 1 is the erratic performance of the system when the clock reference 12 becomes unavailable. For example, in fiber optic applications, a stable clock is required to generate an AIS signal when the system clock reference that locks every card becomes unavailable. When there is a reference failure, the PLL has to switch to a local crystal to be able to supply an AIS alarm signal to the far end equipment. Such a switch can cause a large frequency offset which is not desired in the optical environment. Prior attempts at solving this problem include forcing a fixed DC reference to the VCXO to establish a holdover value. This method is inaccurate and can cause the PLL output to largely exceed the SMC (SONET minimum clock)clock requirement.

Therefore, there remains a need in this field for an improved PLL circuit that overcomes the problems noted herein.

SUMMARY OF THE INVENTION

The present invention meets the foregoing needs by providing a phase locked loop (PLL) circuit includes an analog holdover circuit that enables the PLL to operate without significant frequency shifts when there is a reference clock signal failure. The PLL includes a phase detector for detecting the phase difference between a reference clock signal and a feedback signal and for generating phase pulse outputs corresponding to this phase difference, an integrator coupled to the phase pulse outputs for generating a phase voltage in proportion to the pulse width of the phase pulse outputs, and a voltage controlled oscillator coupled to the phase voltage for generating a local oscillator signal that is synchronized to the reference clock signal and which is coupled to the feedback signal. The analog holdover circuit generates a driving signal for driving the integrator to maintain its output voltage level at a previously stored voltage level when there is a reference clock failure.

The present invention provides many advantages over the presently known PLL circuits. Not all of these advantages are simultaneously required to practice the invention as claimed, and the following list is merely illustrative of the types of benefits that may be provided, alone or in combination, by the present invention. These advantages include: (1) providing a low cost mechanism that eliminates the need of a local source of clock; (2) establishing a holdover value that is related to the last voltage level input to the VCXO before failure to guaranty a smooth clock transition when there is an input reference signal failure; (3) providing a non-complex hardware design solution that comprises a low cost comparator and digital circuitry that can be integrated into a FPGA or an ASIC; and (4) providing a circuit that can compensate for VCXO aging since a now holdover value can be calculated daily.

In accordance with the present invention, a phase locked loop is provided. The phased lock loop includes: (1) a phase detector coupled to a reference clock signal and a feedback signal for generating positive and negative phase detection signals corresponding to the phase difference between the reference clock signal and the feedback signal; (2) an integrator coupled to the positive and negative phase detection signals for generating an output voltage proportional to the pulse width of either the positive or negative phase detection signals, the integrator including an operational amplifier having positive and negative inputs; (3) a voltage controlled oscillator coupled to the output voltage of the integrator for generating a local oscillator signal with an oscillation frequency proportional to the output voltage of the integrator; (4) a feedback circuit coupled to the local oscillator signal for generating the feedback signal; and (5) an analog holdover circuit for generating an input to the integrator when the phase detector stops receiving the reference clock signal.

Another aspect of the invention provides an improved phase locked loop having a phase detector for comparing a reference signal with a feedback signal and for generating phase pulses having a pulse width corresponding to the phase difference between the reference signal and the feedback signal, an integrator coupled to the phase pulses for generating a voltage level corresponding to the pulse width of the phase pulses, wherein the integrator includes an operational amplifier having positive and negative inputs, and a voltage controlled oscillator coupled to the voltage level for generating the feedback signal. The improvement includes an analog holdover circuit for generating an input to the integrator when the phase detector stops receiving the reference clock signal.

Still another aspect of the invention provides a phase locked loop, comprising: (1) means for detecting the phase difference between a reference clock signal and a feedback signal; (2) means for generating a phase voltage corresponding to the phase difference between the reference clock signal and the feedback signal; (3) means for generating the feedback signal, wherein the feedback signal is characterized by a frequency that varies in proportion to the phase voltage; and (4) means for generating an input to the integrator when the phase detector stops receiving a reference clock signal.

Another aspect of the invention provides an improved phase locked loop having a phase detector, a voltage controlled oscillator, and an integrator coupled between the phase detector and the voltage controlled oscillator, wherein the integrator includes a positive input and a negative input. The improvement includes an analog holdover circuit coupled to at least one of the positive or the negative inputs of the integrator, said analog holdover circuit being operative to generate an input to the integrator when the phase detector stops receiving a reference clock signal.

BRIEF DESCRIPTION OF THE DRAWINGS

The present invention will become more apparent from the following description when read in conjunction with the accompanying drawings wherein.

DETAILED DESCRIPTION OF THE DRAWINGS

Figure 1:
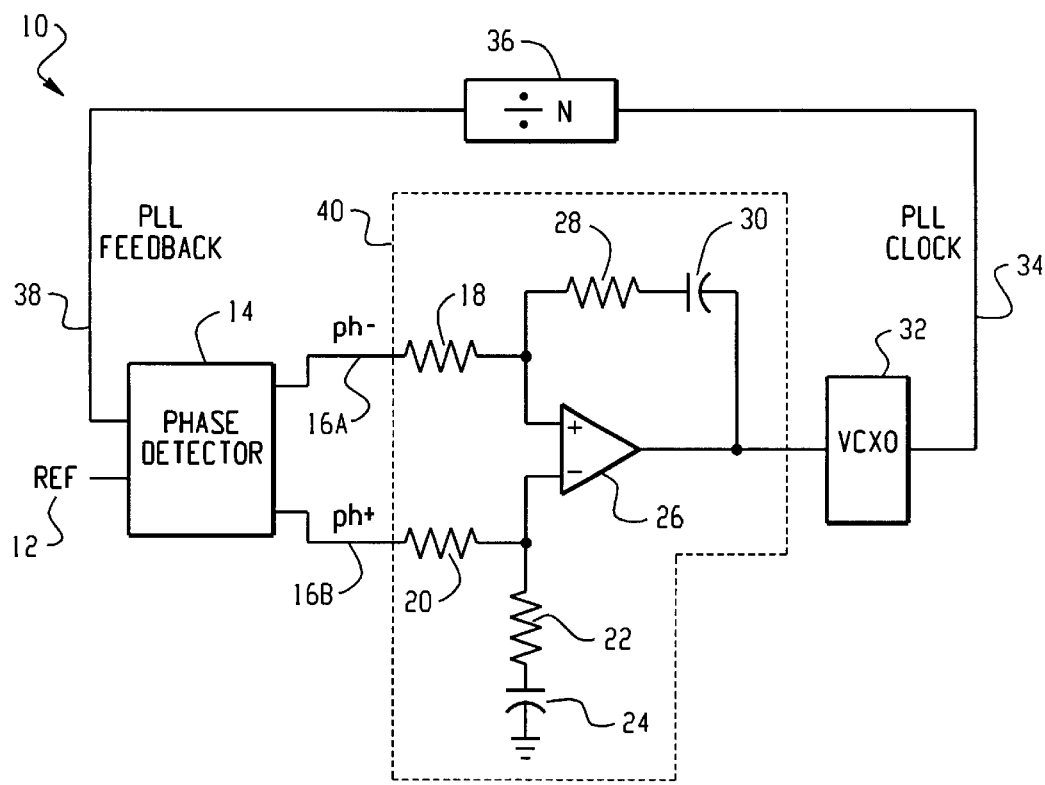
FIG. 1 is a circuit diagram of a known PLL.
Figure 2:
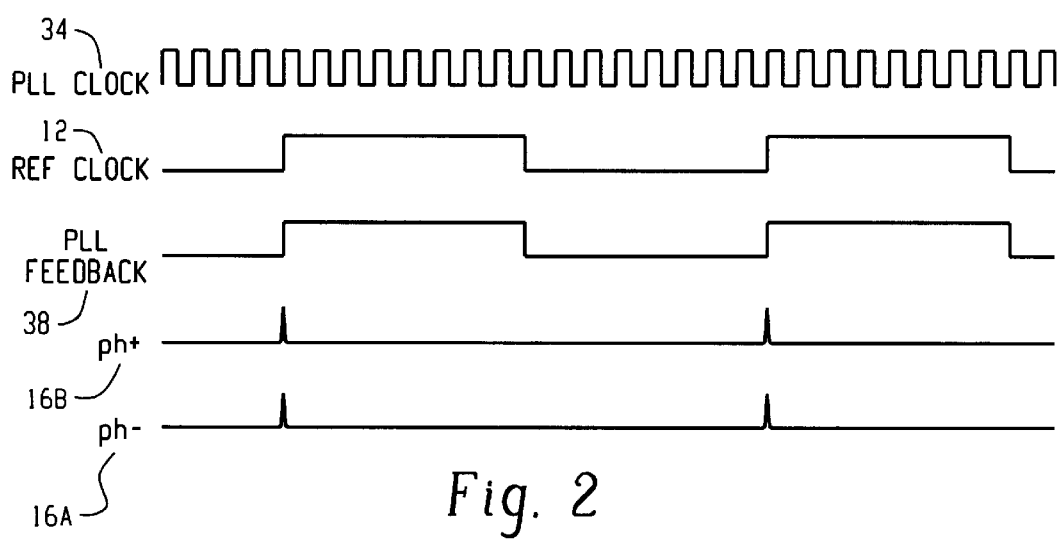
FIG. 2 is a timing diagram showing the operation of the PLL set forth in FIG. 1.
Figure 3:
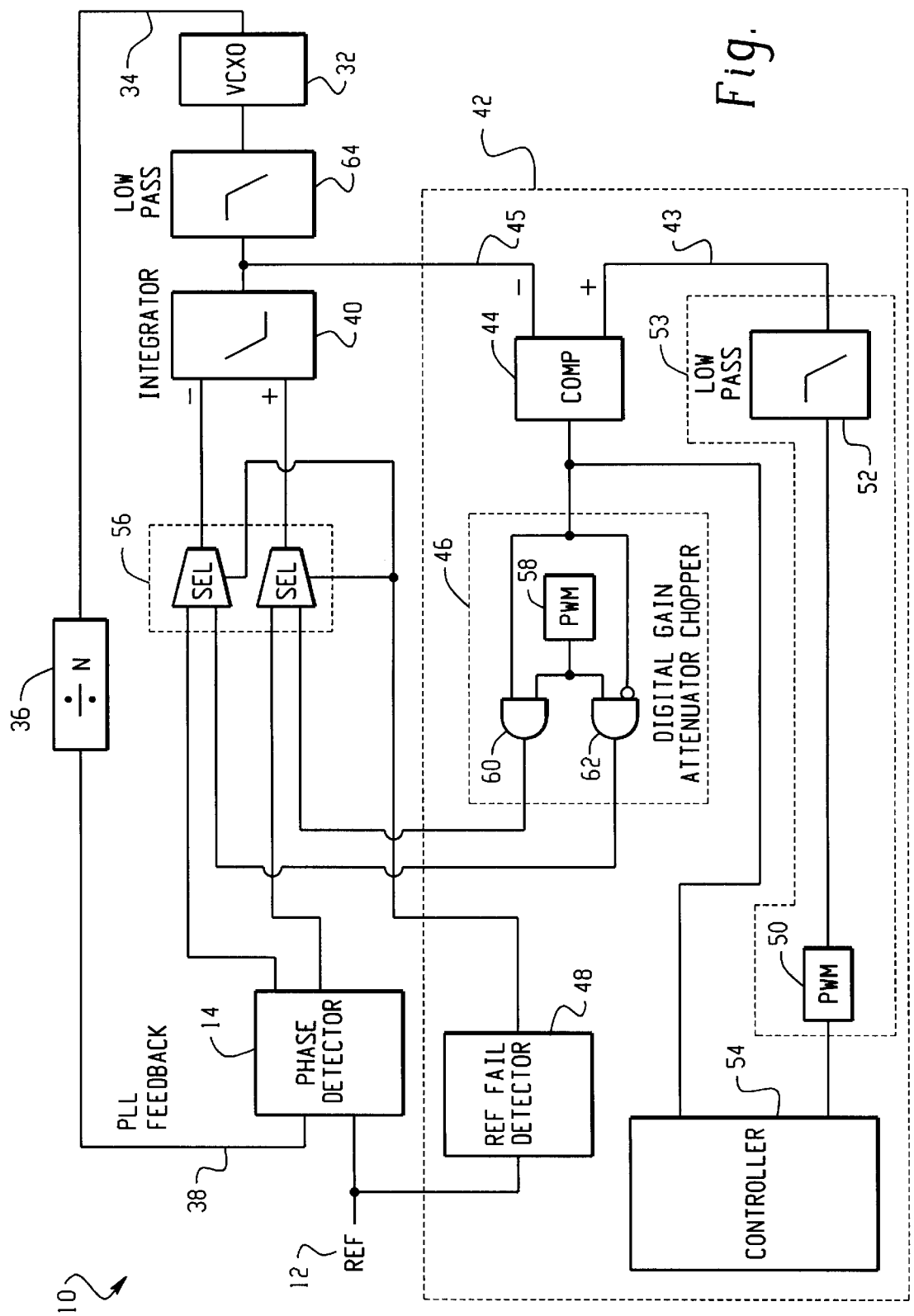
FIG. 3 is a block diagram of a PLL having the analog holdover mechanism.

Turning now to the remaining drawing figures, FIG. 3 is a circuit diagram of a first embodiment of a PLL circuit 11) according to the present invention. Similar to the circuit shown in FIG. 1, this circuit 10 includes a phase detector 14, an integrator 40, a voltage controlled oscillator 32, and a counter 36 configured as a divider. The operation of these elements is similar to that described with reference to FIG. 1. In addition, however, the circuit shown in FIG. 3 includes an analog holdover circuit 42 coupled to the forward path of the PLL 10. The analog holdover circuit 42 provides a driving signal for the integrator 40 in the absence of an external reference clock signal 12. The preferred analog holdover circuit 42 comprises a comparator 44, a digital gain attenuator 46, a reference fail detector 48, a pulse width modulator 50, a low pass filter 52, a controller 54, and a switch 56.

If there is a reference input 12 failure, such as a loss of the reference input signal 12, prior art PLLs 10 will not be able to maintain the charge on the integrator 40 forcing the voltage controlled oscillator 32 to oscillate at an undesired frequency if the phase detector 14 is not disconnected. The analog holdover circuit 42 of the present invention solves this problem by driving the integrator 40 to maintain a stable DC voltage level at its output using a minimal number of components.

When the PLL 10 is operating normally, i.e., when the reference input 12 is normal, the analog holdover circuit 42 monitors the DC voltage level 45 at the integrator 40 output and saves that voltage level. When a failure associated with the reference input 12 is detected, the analog holdover circuit 42 generates a stable DC voltage level 43 that is equivalent to the saved integrator output voltage level and uses that generated voltage level 43 to drive the integrator 40 to generate a DC voltage level 45 that is equivalent to the stable DC voltage level 43. The DC voltage level 43 is generated by a DC voltage generator 53 that preferably comprises a pulse width modulator 50 that is coupled to a low pass filter 52.

The preferred operation of the analog holdover circuit 42 when there is a reference input failure will be described next. When the PLL input reference 12 falls, the reference fall detector 48 detects the failure and signals the selector switch 56 to disconnect the phase detector 14 from the integrator 40 and to connect the digital gain attenuator 46 output to the input of the integrator 40. The reference fail detector 48 could comprise any number of circuits or devices such as a counter or timer that estimates when the next pulse from the reference should occur and determines that there is a failure if the pulse is not received. The selector switch 56 could comprise a number of devices such as a pair of data selectors that are each switchable to connect one of a plurality of its inputs to its output.

Also upon the reference fail detection, the DC voltage generator 53 generates a stable DC voltage 43 that is equivalent to a voltage level previously stored by the analog holdover circuit 42. The stable DC voltage 43 is coupled to an input of the comparator 44 and is compared by the comparator 44 to the integrator output 45, which is coupled to the other comparator input. The output of the comparator 44 is used to drive the integrator 40 such that the integrator output voltage 45 is approximately equal to the stable DC voltage reference 43. When the integrator output 45 is higher than the DC reference voltage 45, the negative input of the integrator 40 is driven to cause the integrator 40 to reduce its output 45. When the integrator output 45 is lower than the DC reference voltage 45, the positive input of the integrator 40 is driven to cause the integrator 40 to increase its output 45. The stable DC voltage 43 is preferably coupled to the positive input of the comparator 44 and the integrator output 45 is preferably coupled to the negative input so that the comparator generates a negative signal when the integrator output 45 is higher than the DC reference voltage 45 and the comparator generates a positive signal when the integrator output 45 is lower than the DC reference voltage 45.

The comparator output preferably is not fed directly to the integrator 40 but fed to digital gain attenuator 46. Because the output of the comparator 44 has only two states, the noise generated by the integrator output may be too high if the comparator output were fed directly into the integrator input (loop has to much gain). To reduce the gain, the digital gain attenuator 46 is used.

The preferred digital gain attenuator 46 comprises a PWM circuit 58 and a pair of AND gates 60, 62. The preferred digital gain attenuator 46 is used to chop the comparator output signal thereby reducing the loop gain. One AND gate provides an output to drive the positive input of the integrator 40 and the other AND gate provides an output to drive the negative input of the integrator 40. Both AND gates receive the output of the PWM as one input and the output of the comparator as the other input. One AND gate 62 uses an inverted comparator output signal to generate a driving signal for the negative input of integrator 40 when the integrator output 45 is higher than the DC reference voltage 45. The other AND gate 60 generates a driving signal for the positive input of integrator 40 when the integrator output 45 is lower than the DC reference voltage 45. For better performance, the PWM circuit 58 should be designed to always maintain its high frequency component as high as possible.

The loop gain for the loop that comprises the path connecting the integrator 40 output, the comparator 44, the digital gain attenuator 46, and the integrator 40 input effects both the noise and the loop bandwidth. Reducing the loop gain will reduce noise at the integrator output but will also reduce the loop bandwidth. Reducing the loop bandwidth make the loop more susceptible to component, noise etc. Therefore, it is important to maintain a good compromise on the loop gain.

The preferred comparator 44 is not a perfect device and consequently has a few millivolts hysteresis built into its input between the high and low switch points. An integrator output noise above this hysteresis level will likely be generated. The noise frequency of this noise level will be fairly high, approximately 200 to 1000 KHz, if a fast comparator and integrator operational amplifier are used, and can be shielded from the input of the VCXO 32 through the use of a low pass filter 64 coupled between the integrator 40 and the VCXO 32.

The DC voltage generator 53 generates a stable DC voltage 43 preferably through the use of a PWM 50 and a low pass filter 52. The output of the PWM 50 is fed to the low pass filter 52, which generates a DC voltage that is proportional to the pulse width of the signal from the PWM 50. Therefore, by controlling the pulse width, the DC voltage level 43 can be controlled.

The controller 54 controls the PWM 50 to generate the DC voltage level 43. The controller 54 preferably is a CPU but alternately could be a microcontroller, a FPGA, a state machine, or some other type of device.

The operation of the analog holdover circuit to determine the stored holdover value 45 will be described next. It is possible to use a fixed PWM value to maintain a fixed DC voltage level when the input reference fails. The present invention provides a mechanism to provide a more accurate holdover value that can be adjusted to more accurately reflect the PLL performance.

When the PLL input reference 12 is present, the integrator 40 will output a stable DC level 45 required to maintain the PLL VCXO lock. The controller 54 preferably monitors the stable DC level 45 by adjusting the output of the PWM 50 to cause the output of the comparator 44 to toggle between its two output levels. The toggle point is equivalent to the stable DC level 45. The controller 54 optionally can perform the monitoring function continuously, periodically on a daily basis or once a day. Periodically, preferably daily, the controller 54 stores the settings used to control the PWM 50 to generate the output voltage 43. As a result the holdover level 43 can be stored for use when there is an input reference failure.

Having described in detail the preferred embodiment of the present invention, including preferred modes of operation, it is to be understood that the present invention could be carried out with different elements and steps. The preferred embodiment is presented only by way of example and is not meant to limit the scope of the present invention, which is defined by the following claims.

What is claimed is:

1. A phase locked loop, comprising:
    a phase detector coupled to a reference clock signal and a feedback signal for generating positive and negative phase detection signals corresponding to the phase difference between the reference clock signal and the feedback signal;
    an integrator coupled to the positive and negative phase detection signals for generating an output voltage in response to pulses from the phase detector;
    a voltage controlled oscillator coupled to the output voltage of the integrator for generating a local oscillator signal with an oscillation frequency proportional to the output voltage of the integrator;

a feedback circuit coupled to the local oscillator signal for generating the feedback signal; and an analog holdover circuit for generating an input to said integrator when said phase detector stops receiving the reference clock signal.

2. The phase locked loop of claim 1 further comprising a reference fall detector circuit that is operative to detect when said phase detector is no longer receiving the reference clock signal.

3. The phase locked loop of claim 2 further comprising a switch that is operable to couple either the phase detector output or the output from the analog holdover circuit to said integrator in response to a signal from the reference fall detector.

4. The phase locked loop of claim 3 wherein said switch comprises a pair of data selectors.

5. The phase locked loop of claim 1 wherein said analog holdover circuit comprises a comparator and a DC voltage generating circuit, said comparator having a first input that is coupled to the output of said integrator and a second input that is coupled to the output of said DC voltage generating circuit, said DC voltage generating circuit being controllable to generate one of a plurality of DC voltage levels.

6. The phase locked loop of claim 5 wherein said analog holdover circuit further comprises a digital gain attenuator chopper that is operative to reduce the gain of a loop comprising said comparator and said integrator, said digital gain attenuator chopper having an input that is coupled to the output of said comparator and an output that is coupled to said integrator through a switch.

7. The phase locked loop of claim 6 wherein said digital gain attenuator comprises a pulse width modulator circuit and a pair of AND gates.

8. The phase locked loop of claim 5 wherein said DC voltage generating circuit comprises a pulse width modulator coupled to a low pass filter.

9. The phase locked loop of claim 5 wherein said analog holdover circuit further comprises a controller that is coupled to said comparator and said DC voltage generating circuit, said controller being operative to monitor the output of said comparator, said controller also being operative to adjust the DC voltage output from said DC voltage generating circuit.

10. The phase locked loop of claim 9 wherein said controller is operative to store a setting that causes ad DC voltage generating circuit to generate a voltage approximately equal to the voltage output from said integrator when the reference clock signal is present at the phase detector.

11. An improved phase locked loop having a phase detector for comparing a reference signal with a feedback signal and for generating phase pulses having a pulse width corresponding to the phase difference between the reference signal and the feedback signal, an integrator coupled to the phase pulses for generating a voltage level corresponding to the pulse width of the phase pulses, and a voltage controlled oscillator coupled to the voltage level for generating the feedback signal, the improvement comprising:

an analog holdover circuit for generating an input to the integrator when the phase detector stops receiving a reference clock signal.

12. The improved phase locked loop of claim 11 wherein said analog holdover circuit comprises a comparator and a DC voltage generating circuit, the comparative having a first input that is coupled to the output of said integrator and a second input that is coupled to the output of said DC voltage generating circuit, said DC voltage generating circuit being controllable to generate one of a plurality of DC voltage levels.

13. The improved phase locked loop of claim 12 wherein said analog holdover circuit further comprises a digital gain attenuator chopper that is operative to reduce the gain of a loop comprising said comparator and said integrator, said digital gain attenuator having an input that is coupled to the output of said comparator and an output that is coupled to said integrator through a switch.

14. The improved phase locked loop of claim 13 wherein said digital gain attenuator comprises a pulse width modulator circuit and a pair of AND gates.

15. The improved phase locked loop of claim 12 wherein said DC voltage generating circuit comprises a pulse width modulator coupled to a low pass filter.

16. The improved phase locked loop of claim 12 wherein said analog holdover circuit further comprises a controller that is coupled to said comparator and said DC voltage generating circuit, said controller being operative to monitor the output of said comparator, said controller also being operative to adjust the DC voltage output from said DC voltage generating circuit.

17. The phase locked loop of claim 16 wherein said controller is operative to store a setting that causes said DC voltage generating circuit to generate a voltage approximately equal to the voltage output from said integrator when the reference clock signal is present at the phase detector.

18. A phase locked loop, comprising:

means for detecting the phase difference between a reference clock signal and a feedback signal;

means for generating a phase voltage corresponding to the phase difference between the reference clock signal and the feedback signal;

means for generating the feedback signal, wherein the feedback signal is characterized by a frequency that varies in proportion to the phase voltage; and means for generating an input to the integrator when the phase detector stops receiving a reference clock signal.

19. The phase locked loop of claim 18, wherein the means for detecting is a phase detector.

20. The phase locked loop of claim 19, wherein the phase detector generates a positive phase output and a negative phase output.

21. The phase locked loop of claim 20, wherein the phase detector outputs a pulse on the positive or negative phase outputs in proportion to the phase difference between the reference clock signal and the feedback signal.

22. The phase locked loop of claim 21, wherein the means for generating a voltage includes an operational amplifier configured as an integrator.

23. The phase locked loop of claim 18, wherein the means for generating the feedback signal includes a voltage controlled oscillator.

24. The phase locked loop of claim 23, wherein the means for generating the feedback signal further includes a divider circuit coupled to the output of the voltage controlled oscillator for generating the feedback signal by dividing down the frequency of a signal output from the voltage controlled oscillator.

25. The phase locked loop of claim 18 wherein the means for generating an input comprises an analog holdover circuit comprising a comparator and a DC voltage generator circuit.

26. An improved phase locked loop having a phase detector, a voltage controlled oscillator, and an integrator coupled between the phase detector and the voltage controlled oscillator, wherein the integrator includes a positive input and a negative input, the improvement comprising:

an analog holdover circuit coupled to at least one of the positive or the negative inputs of the integrator, said analog holdover circuit being operative to generate an input to the integrator when the phase detector stops receiving a reference clock signal.

27. The improved phase locked loop of claim 26, wherein said analog holdover circuit is coupled to both the positive and negative inputs of the integrator.

28. The improved phase locked loop of claim 27, wherein said analog holdover circuit comprises a comparator and a DC voltage generating circuit, the comparator having a first input that is coupled to the output of said integrator and a second input that is coupled to the output of said DC voltage generating circuit, said DC voltage generating circuit being controllable to generate one of a plurality of DC voltage levels.

29. The improved phase locked loop of claim 28 wherein said analog holdover circuit further comprises a digital gain attenuator chopper that is operative to reduce the gain of a loop comprising said comparator and said integrator, said digital gain attenuator chopper having an input that is coupled to the output of said comparator and an output that is coupled to said integrator through a switch.

30. The improved phase locked loop of claim 29 wherein said digital gain attenuator comprises a pulse width modulator circuit and a pair of AND gates.

31. The improved phase locked loop of claim 28 wherein said DC voltage generating circuit comprises a pulse width modulator coupled to a low pass filter.

32. The improved phase locked loop of claim 28 wherein said analog holdover circuit further comprises a controller that is coupled to said comparator and said DC voltage generating circuit, said controller being operative to monitor the output of said comparator, said controller also being operative to adjust the DC voltage output from said DC voltage generating circuit.

33. The improved phase locked loop of claim 32 wherein said controller is operative to store a setting that causes said DC voltage generating circuit to generate a voltage approximately equal to the voltage output from said integrator when the reference clock signal is present at the phase detector.

34. A method of controlling a phase locked loop having a phase detector, a voltage controlled oscillator, and an integrator coupled between the phase detector and the voltage controlled oscillator, comprising the steps of:

storing the voltage output level from the integrator when there is a reference signal input present at the phase detector;

detecting a reference signal failure; and generating a driving signal for the integrator when said reference signal failure is detected, said driving signal being operative to drive the integrator to output a voltage level that is equivalent to the stored voltage level.

35. The method of claim 34 wherein said generating step comprises the steps of:

generating a DC voltage level based on the stored voltage level;

comparing the generated DC voltage level to the stored voltage level; and coupling the output of the comparison to the integrator.

36. The method of claim 35 wherein said coupling step comprises the steps of:

coupling a digital gain attenuator chopper between the comparison output and the integrator to reduce the loop gain.

* * * * *

UNITED STATES PATENT AND TRADEMARK OFFICE
CERTIFICATE OF CORRECTION

PATENT NO.    : 6,313,708 B1
DATED         : November 6, 2001
INVENTOR(S)   : Rejean Beaulieu It is certified that error appears in the above-identified patent and that said Letters Patent is hereby corrected as shown below:

<u>Column 7,</u>
Lines 9 and 15, change "fall" to -- fail --
Line 47, change "ad" to -- said --

Signed and Sealed this

Ninth Day of April, 2002

*Attest:*

*Attesting Officer*

JAMES E. ROGAN
*Director of the United States Patent and Trademark Office*